United States Patent [19]

Uehara et al.

[11] Patent Number: 4,723,846

[45] Date of Patent: Feb. 9, 1988

[54] OPTICAL PATH LENGTH COMPENSATING OPTICAL SYSTEM IN AN ALIGNMENT APPARATUS

[75] Inventors: Makoto Uehara, Tokyo; Kazumasa Endo, Kawasaki; Susumu Mori, Tama; Shuhei Takagi; Yukio Kakizaki, both of Yokohama, all of Japan

[73] Assignee: Nippon Kogaku K. K., Tokyo, Japan

[21] Appl. No.: 895,953

[22] Filed: Aug. 13, 1986

[30] Foreign Application Priority Data

Aug. 20, 1985 [JP] Japan .................. 60-182436

[51] Int. Cl.$^4$ .................... G01B 11/00; G02B 13/22
[52] U.S. Cl. ..................... 356/401; 350/415
[58] Field of Search ............... 356/400, 401; 250/491.1, 557; 355/55; 350/415, 425, 450

[56] References Cited

U.S. PATENT DOCUMENTS 4,592,625  6/1986  Uehara et al. ............ 350/415

Primary Examiner—Eugene R. LaRoche
Assistant Examiner—David Mis
Attorney, Agent, or Firm—Shapiro and Shapiro

[57] ABSTRACT

An optical path length compensating device comprises a first objective having one focus coincident with a two-dimensional plane and provided for movement along the two-dimensional plane, a second objective having one focus coincident with a predetermined focal plane, first and second reflecting means provided in the optical path between the first objective and the second objective for movement along the optical path, the first reflecting means including at least one reflecting surface for turning the optical path from the first objective by a predetermined angle in a plane parallel to the two-dimensional plane, the second reflecting means including at least one pair of reflecting surfaces for directing the light from the first reflecting means to the second objective, means for moving the first objective and the first reflecting means in operative association with each other, and means for moving the second reflecting means so that the other focus of the first objective and the other focus of the second objective are coincident with each other.

4 Claims, 4 Drawing Figures

OPTICAL PATH LENGTH COMPENSATING OPTICAL SYSTEM IN AN ALIGNMENT APPARATUS

BACKGROUND OF THE INVENTION

1. Field of the Invention

This invention relates to an optical path length compensating optical system in an optical apparatus, and in particular to an optical path length compensating optical system suitable as the alignment optical system of an exposure apparatus used in the photolithography process of the manufacture of semiconductors.

2. Related Background Art

Along with the tendency of semiconductor integrated circuits toward higher integration, the exposure apparatuses used in the photolithography process have been experiencing the remarkable shift from the contact system or the mirror projection system to the reduction projection exposure system which enables more minute transfer to be accomplished. This system is a system in which the pattern of a reticle is reduction-transferred to a wafer by a reduction projection type exposure apparatus (hereinafter referred to as the "stepper"). Usually, a reticle pattern of 100 mm×100 mm to 75 mm×75 mm is reduced to 1/10–1/5 by a projection lens and is exposed on a wafer having a diameter of 100 mm to 150 mm in exposure areas of 10 mm×10 mm to 15 mm×15 mm in succession while involving the moving operation of a stage fed at the interferometer standard called the step and repeat, whereby transfer is accomplished.

In the semiconductor manufacturing process, ten and several times of exposure and process treatment are repeated even for the same exposure area and in that case, there is required the so-called alignment in which a new reticle pattern is optically superposedly transferred onto the pattern transferred during the preceding process, at desired accuracy. In this case, ideally, it is desirably to superpose an alignment mark included in the new reticle pattern upon an alignment mark included in the pattern on the wafer transferred during the preceding process, with substantially the same wavelength as that during the exposure, through a reduction projection lens, and shift to the next exposure. A method in which alignment is thus effected for each exposure in order to ensure the accuracy and only the portion exposed once is aligned is called the die-by-die alignment, and in this die-by-die alignment, it is necessary to bring the alignment optical system into coincidence with the alignment mark on the reticle. This alignment mark is provided around the pattern on the reticle, but the size of the pattern differs depending on the design of the semiconductor circuit and therefore, to bring the alignment optical system into coincidence with that alignment mark, it is requisite to move the alignment optical system in accordance with the different size of the pattern.

Further, to realize highly accurate die-by-die alignment, it is necessary not only to confirm the coincidence between the alignment marks of the reticle and the wafer, but also to photoelectrically detect the alignment at high accuracy to thereby accomplish the alignment automatically. For this purpose, it is necessary to detect the alignment signal at the pupil position of the alignment optical system as a Fourier conversion surface, and it is desirable that the pupil position be maintained invariable in spite of the movement of the alignment optical system.

On the other hand. the technique of so-called optical trombone in which a pair of plane mirrors obliquely disposed in a parallel light beam are parallel-moved to correct the length of the optical path has heretofore been used in a projection inspection apparatus or the like and is well known, and a projection type exposure apparatus in which the conjugate relation between the image and the pupil is maintained by the use of this optical trombone optical system is already known, for example, from Japanese Laid-Open Patent Application No. 150924/1983 (corresponding to U.S. patent application Ser. No. 469,015 filed on Feb. 23, 1983 now U.S. Pat. Ser. No. 4,592,625). The alignment optical system described in this prior art is designed such that only the variation in the length of the optical path for the change in the position of the alignment mark in one direction (x direction) on the reticle can be corrected, and this leads to the following disadvantages.

In the die-by-die alignment, confirmation of alignment is generally effected by a light of substantially the same wavelength as the exposure wavelength and therefore, furing the alignment, the alignment mark on the then used wafer is exposed, and disappears after the process and thus, is not reusable. Accordingly, during the next alignment, it is necessary to effect alignment by the use of an unexposed mark in y direction adjacent to that alignment mark which has disappeared. Therefore, when the pattern size and the position of the alignment mark during each exposure process are taken into consideration, it is desirable that the objective in the alignment optical system which is opposed to the reticle be designed so as not only to be movable with respect to an axis (x direction) but also to be panarily (two-dimentionally) with respect to two axis (x and y directions). Moreover, in order that highly accurate alignment may be accomplished in that case, it is necessary that the position of the pupil of the alignment optical system as a Fourier conversion surface be stably maintained. However, the aforedescribed well-known alignment optical system is designed such that the trombone optical system effectively acts on only the movement of the objective in one direction (x direction) and therefore, during the alignment in a direction perpendicular thereto (y direction), the entire alignment optical system must be moved in y direction, and this leads not only to the bulkiness of the apparatus but also to a disadvantage that quick and precise alignment operation becomes impossible. Also, where each one set of alignment optical systems is disposed on the left and right of the reticle to effect alignment not only in x and y directions but also in the direction of rotation, the respective alignment optical systems can be independently moved in x direction to thereby accomplish alignment freely, but in y direction perpendicular thereto, the left and right alignment optical systems must be moved as a unit, and this leads to a disadvantage that the design of the semiconductor circuit regarding the alignment mark is greatly limited thereby.

SUMMARY OF THE INVENTION

It is an object of the present invention to overcome the above-noted disadvantages peculiar to the apparatus according to the prior art and to provide an optical path length compensating optical system which can maintain the conjugate relation between the image and the pupil even if an objective is freely moved in a two-dimensional plane in conformity with the change in the position of an alignment mark.

To achieve the above object, the present invention includes a first objective having its forward focus position as the object point and movable along a predetermined two-dimensional plane including said object point, a second objective having its rearward focus point as the image point, and first and second reflecting means movable disposed along the optical path between said first objective and said second objective. Said first reflecting means has at least one reflecting surface turning the light from said first objective by a predetermined angle along said two-dimensional plane and movable with said first objective, said second reflecting means has at least one pair of reflecting surfaces for directing the light from said first reflecting means to said second objective, and said second reflecting means is movable so that the rearward focus position of said first objective and the forward focus position of said second objective are always coincident with each other.

According to the present invention, even if the first objective is moved in a two-dimensional plane, the conjugate relation with the first reflecting means which follows the movement of the first objective is kept by movement in a one-dimensional direction and therefore, a high accuracy and high reliability of the apparatus can be obtained by a relatively simple construction and, when two points in the same object to be examined or the like are to be enlarged at a time to effect positioning, measurement or inspection, it becomes possible to move a plurality of objectives independently of one another and therefore, the range of use of the apparatus is widened and the handling of the apparatus can be simplified.

DESCRIPTION OF THE PREFERRED EMBODIMENTS

Figure 1:
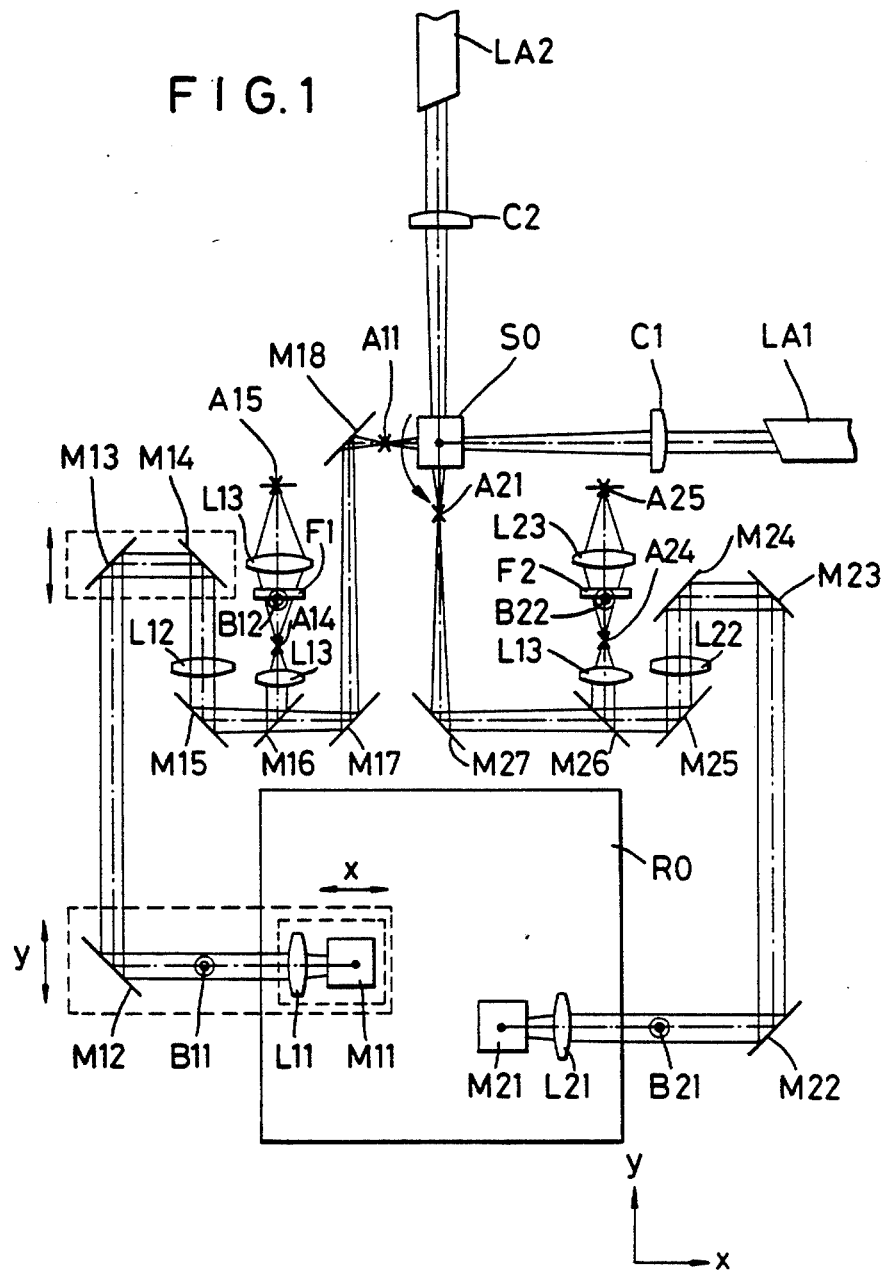
FIG. 1 is a plan arrangement view of an optical system showing an embodiment of the present invention incorporated in the alignment optical system of a reduction projection type exposure apparatus.
Figure 2:
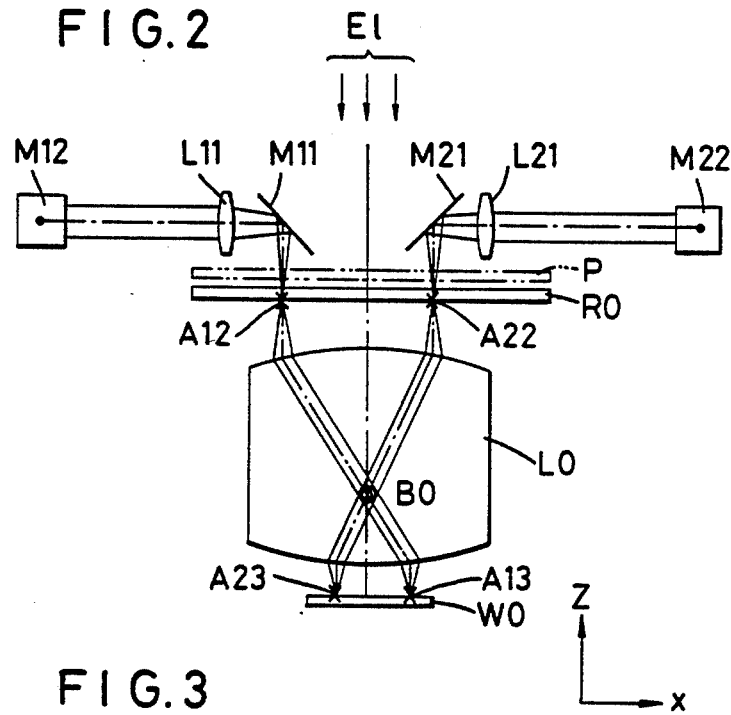
FIG. 2 is an elevational arrangement view showing the objective portion of the embodiment shown in FIG. 1.

FIGS. 1 and 2 show an embodiment of the present invention used in a reduction projection type exposure apparatus.

The pattern image of a pattern on a reticle $R_0$ uniformly illuminated by the illuminating light El (g-line: 435.8 nm) from a super-high pressure mercury lamp, not shown, is projected onto a wafer $W_0$ by a projection lens $L_0$.

On the other hand, the parallel light beams from two He.Cd lasers $LA_1$ and $LA_2$ which emit light of a wavelength (442 nm) substantially equal to that of the illuminating light El for exposure are orthogonal to each other, as shown in FIG. 1, and pass through a transmission type scanner $S_0$ provided at the point of intersection between the parallel light beams. The transmission type scanner $S_0$ is designed so as to rotate about an axis perpendicular to the plane of the drawing sheet and parallel-move the laser beams in conformity with the rotation thereof. Cylindrical lenses $C_1$ and $C_2$ are diposed between the transmission type scanner $S_0$ and the lasers $LA_1$, $LA_2$ so that the laser lights pass through the transmission type scanner $S_0$ and at the positions of points $A_{11}$ and $A_{21}$, the laser light in the direction of the axis of the cylindrical lens having refractive power (hereinafter referred to as the "C-axis") is converged and imaged and the laser light in the direction of an axis free from the refractive power (hereinafter referred to as the "S-axis") passes as a parallel light beam. The bus lines (parallel to the S-axis) of the cylindrical surfaces of these cylindrical lenses $C_1$ and $C_2$ are provided perpendicularly to the plane of the drawing sheet.

In FIG. 1, the laser light travelling leftwardly past the point $A_{11}$ is turned downwardly by an eighth mirror $M_{18}$, is further turned leftwardly by a seventh mirror $M_{17}$ and is transmitted through a half-mirror $M_{16}$, whereafter it is turned upwardly by a fifth mirror $M_{15}$ and enters a second objective $L_{12}$. The second objective $L_{12}$ is disposed so that its rearward focus position is coincident with the point $A_{11}$, and the laser light of the C-axis travels while being made into a parallel light beam by the second objective $L_{12}$ and is turned back downwardly by a movable fourth mirror $M_{14}$ and a third mirror $M_{13}$ which together constitute an optical trombone, is further turned rightwardly by a movable mirror $M_{12}$ and enters a first objective $L_{11}$. The first objective $L_{11}$ is disposed so that its forward focus position lies at a point $A_{12}$ (see FIG. 2) on the pattern surface of the reticle $R_0$ via a mirror $M_{11}$, and the laser light of the C-axis if designed so as to be again converged and imaged at the point $A_{12}$.

Figure 3:
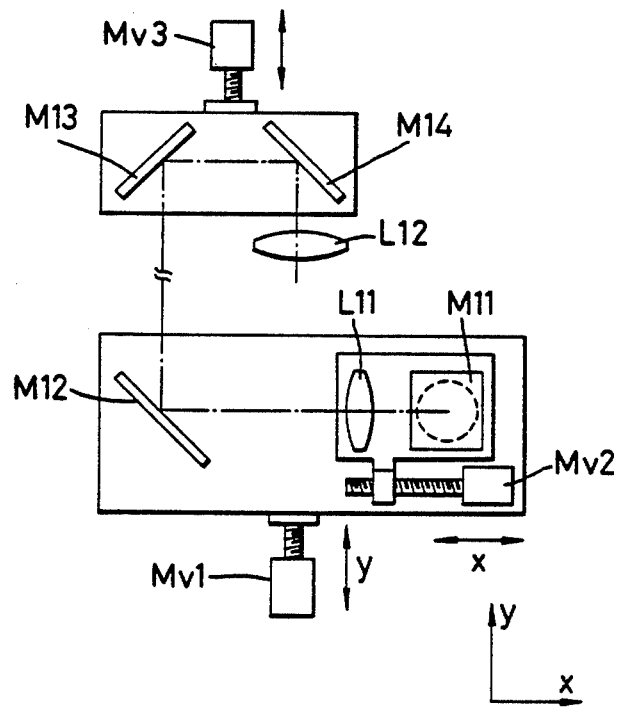
FIG. 3 is a schematic plane view showing the optical system moving device of the embodiment shown in FIG. 1.

The movable mirror $M_{12}$ is designed so as to be moved in y direction with the first objective $L_{11}$ and the mirror $M_{11}$ by a moving device $M_{v1}$ as shown in FIG. 3, and the first objective $L_{11}$ and the mirror $M_{11}$ in turn are designed so as to be moved in x direction independently of the movable mirror $M_{12}$ by a moving device $M_{v2}$. In this case, the first objective $L_{11}$ and the mirror $M_{11}$ are designed for displacement in x direction and y direction in a two-dimensional plane parallel to the reticle $R_0$, and the length of the optical path between the first objective and the reticle $R_0$ is invariable unless the thickness of the reticle $R_0$ is varied.

On the other hand, the pair of mirrors $M_{13}$ and $M_{14}$ constituting the optical trombone are designed so as to be moved together for the correction of the length of the optical path along the optic axis of the second objective $L_{12}$ by a correcting moving device $M_{v3}$, and so that even if the first objective $L_{11}$ is moved in any of x direction and y direction, the forward focus position $B_{11}$ of the second objective $L_{12}$ is always coincident with the rearward focus position of the first objective $L_{11}$.

On the other hand, the laser light of the S-axis of the parallel light beam entering the second objective $L_{12}$ is converted and imaged at the forward focus position $B_{11}$ of the second objective $L_{12}$ by the second objective $L_{12}$. Since the first objective $L_{11}$ is disposed so that its rearward focus position is coincident with the forward focus position $B_{11}$ of the second objective $L_{11}$, the laser light of the S-axis is again made into a parallel light beam by the first objective $L_{11}$. That is, the second objective $L_{12}$ and the first objective $L_{11}$ together constitute an afocal system with respect to the laser light of the S-axis. Therefore, the laser light of the C-axis is converged and imaged at the forward focus position $A_{12}$ on the reticle $R_0$ by the first objective $L_{11}$, and the laser light of the S-axis becomes a parallel light beam. Accordingly, the laser light beam at the point $A_{12}$ on the reticle $R_0$ becomes an elliptical beam elongated in x-direction.

On the other hand, the laser light emitted from the other laser $LA_2$ has its C-axis imaged at the point $A_{21}$, whereafter it travels through a seventh mirror $M_{27}$, a half-mirror $M_{26}$, a fifth mirror $M_{25}$ and a second objective $L_{22}$ disposed substantially symmetrically with the left-hand light transmitting system as viewed in FIG. 1, and a fourth mirror $M_{24}$, a third mirror $M_{23}$ and a movable mirror $M_{22}$ which together constitute an optical trombone, and the laser light of the S-axis is imaged at a point $B_{21}$ and further, the laser light of the C-axis is imaged at a point $A_{22}$ on the reticle $R_0$ through a first objective $L_{21}$ and a mirror $M_{21}$. The constructions of these optical elements are the same as those of the aforedescribed left-hand light transmitting system and therefore need not be described in detail. The moving device for moving the optical system is also similar to the above-described one and therefore need not be described.

In FIG. 2, the lower surface (pattern surface) of the reticle $R_0$ and the upper surface (transfer surface) of the wafer $W_0$ are disposed at image-conjugate positions with respect to the reduction projection lens $L_0$, and the reduction projection lens $L_0$ is designed such that both of the principal rays on the object side (the reticle $R_0$ side) and the image side (the wafer $W_0$ side) are parallel to the optic axis and telecentric on both sides. Therefore, as shown in FIG. 2, the laser light of the C-axis imaged at the point $A_{12}$ on the reticle $R_0$ passes through the pupil position $B_0$ of the reduction projection lens $L_0$ and is re-imaged at a point $A_{13}$ on the wafer $W_0$. Also, the laser light of the S-axis is converged and imaged at the pupil position $B_0$ and again becomes a parallel light beam on the image side and arrives at the point $A_{13}$. Likewise, the laser light of the C-axis imaged at a point $A_{22}$ on the reticle $R_0$ passes through the pupil position $B_0$ and is re-imaged at a point $A_{23}$ on the wafer $W_0$, and the laser light of the S-axis is converged and imaged at the pupil position $B_0$ and becomes a parallel light beam on the image side and arrives at the point $A_{23}$. That is, in the above-described light transmitting system, the laser light passing through the left-hand optical trombone system becomes an elliptical beam at the points $A_{11}$, $A_{12}$ and $A_{13}$ image-conjugate with one another, and on the right-hand side, said laser light likewise becomes an elliptical beam at the image-conjugate points $A_{21}$, $A_{22}$ and $A_{23}$. Accordingly, the alignment mark on the reticle $R_0$ and the alignment mark on the wafer $W_0$ are scanned in the direction of the minor axis of the ellipse (the C-axis of the laser light) by the elliptical beam in accordance with the rotation of the transmission type scanner $S_0$.

In the alignment optical system, description will now be made of a light receiving system in which detection of the positions of the alignment marks is effected following the optical path conversely to the above-described light transmitting system. In this case, in FIG. 1, the left-hand light receiving system and the right-hand light receiving system are disposed substantially symmetrically with each other and the functions of the various portions thereof are identical and therefore, only the left-hand light receiving system will be described in detail and the right-hand light receiving system will not be described.

The laser light reflected from the alignment mark lying at the point $A_{12}$ on the wafer $W_0$ passes through the pupil position $B_0$ of the reduction projection lens $L_0$ and the point $A_{12}$ on the reticle $R_0$ which is image-conjugate with the wafer $W_0$, and together with the reflected light from the alignment mark lying at the image-conjugate point $A_{12}$, if reflected by the mirror $M_{11}$ and made into a parallel light beam by the first $L_{11}$. The parallel light beam passes through a point $B_{11}$ conjugate with the pupil position $B_0$ of the reduction projection lens $L_0$, is reflected by the movable mirror $M_{12}$ and is further reflected by the pair of mirrors $M_{13}$ and $M_{14}$ constituting the optical trombone, whereafter it enters the second objective $L_{12}$. The light passed through the second objective $L_{12}$ is reflected by the fifth mirror $M_{15}$ and the half-mirror $M_{16}$, and arrives at an image-conjugate point $A_{14}$ through a pupil imaging lens $L_{13}$, and the images of the alignment mark on the reticle $R_0$ and the alignment on the wafer $W_0$ are superposedly formed at the position of the image-conjugate point $A_{14}$.

The pupil imaging lens $L_{13}$ is provided to re-image the pupil lying at the forward focus position $B_{11}$ of the second objective $L_{12}$, and the rearward focus position $B_{12}$ of the pupil imaging lens $L_{13}$ becomes an image-conjugate position, and a space filter $F_1$ is disposed on the pupil conjugate point $B_{12}$. The light passed through the image-conjugate point $A_{14}$ is subjected to spatial frequency filtering by the space filter $F_1$, and the object image by the diffracted light subjected to said filtering is formed at an image-conjugate point $A_{15}$ by a relay lens $L_{13}$. An image pickup element or the like is provided at the image-conjugate point $A_{15}$, and detection of the positions of the alignment marks is effected by the information from the image pickup element or the like.

Figure 4:
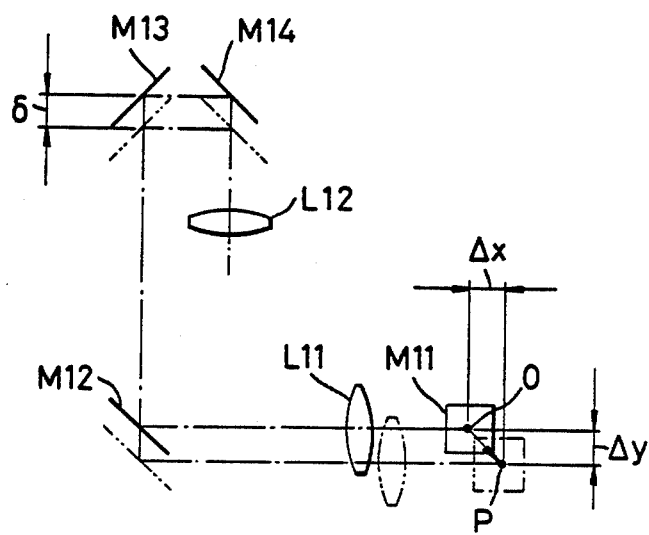
FIG. 4 illustrates the optical path length compensation in the embodiment shown in FIG. 1.

In the above-described light receiving system, a case will now be considered where for the preparation for alignment, the left-hand first objective $L_{11}$ together with the mirror $M_{11}$ is moved relative to the reticle $R_0$ in a two-dimensional plane parallel to the reticle $R_0$ and the optic axis is made coincident with an alignment mark provided at another position on the reticle $R_0$. Let it be assumed that the mirror $M_{11}$ together with the first objective $L_{11}$ is displaced from a point O to a point P in FIG. 4. The amount of movement OP of the mirror $M_{11}$ is resolved into x direction and y direction by the x-axis moving device $M_{v2}$ and the y-axis moving device $M_{v1}$. Thus, the length of the optical path between the movable mirror $M_{12}$ and the first objective $L_{11}$ is varied by the amount of movement $\Delta x$ in x direction and the length of the optical path between the movable mirror $M_{12}$ and the third mirror $M_{13}$ is varied by the amount of movement $\Delta y$ in y direction, and the amount of variation in the length of the optical path between the first objective $L_{11}$ and the second objective $L_{12}$ is equal to $\Delta x + \Delta y$. On the other hand, when the pair of mirrors $M_{13}$ and $M_{14}$ is moved by $\delta$ along the optic axis of the second objective $L_{12}$ by the correcting moving device $M_{v3}$, the length of the optical path between the first objective lens $L_{11}$ and the second objective $L_{12}$ is varied by $2\delta$. Accordingly, to correct the variation in the length of the optical path between the first objective $L_{11}$ and the second objective $L_{12}$ produced when the mirror $M_{11}$ and the first objective $L_{11}$ are moved by $\Delta x$ and $\Delta y$, respectively, and maintain the length of the optical path constant, the pair of mirrors $M_{13}$ and $M_{14}$ may be moved so as to satisfy the following equation:

$$\delta = (\Delta x + \Delta y)/2 \qquad (1)$$

If the mirrors $M_3$ and $M_4$ constituting the optical trombone are moved in accordance with the above equation (1), the forward focus position of the second objective $L_{12}$ can always be made coincident with the rearward focus position of the first objective $L_{11}$, and even if the first objective $L_{11}$ is moved, the image-conjugate point $A_{14}$ is kept constant and the pupil-conjugate point $B_{12}$ is also maintained at a predetermined position without moving. Thus, stabe alingment of good accuracy can always accomplished.

With respect also to the right-hand light receiving system, correction of the length of the optical path is effected in a similar manner, and the object image is formed at an image-conjugate point $A_{24}$ through the pupil imaging lens $L_{23}$. Further, the light passed through the image-conjugate point $A_{24}$ is subjected to spatial frequency filtering by a space filter $F_2$ provided at a pupil-conjugate point $B_{22}$ formed by the pupil imaging lens $L_{23}$, and the object image by the diffracted light subjected to said filtering is formed at an image-conjugate point $A_{25}$ by the relay lens $L_{23}$.

When the thickness and kind of the reticle $R_0$ differ, an error may occur in the length of the optical path between the image-conjugate point $A_{12}$ on the reticle $R_0$ and the first objective $L_{11}$ and in some cases, the image-conjugate position $A_{14}$ and the pupil-conjugate position $B_{12}$ may vary to an unallowable degree. When the refractive index of the reticle $R_0$ is n and the difference in thickness is $\Delta t$, the difference $\Delta l$ in the length of the optical path from the point $A_{14}$ to the first objective $L_{11}$ is given by the following equation:

$$\Delta l = \Delta t(1 - 1/n) \quad (2)$$

In this case, the first objective $L_{11}$ may be displaced by $\Delta l$ relative to the mirror $M_{11}$ and the pair of mirrors $M_{13}$ and $M_{14}$ constituting the optical trombone may be moved by one-half of $\Delta l$, thereby keeping the length of the optical path between the first objective $L_{11}$ and the second objective $L_{12}$ invariable. Also, instead of the first objective $L_{11}$ being displaced, the second objective $L_{12}$ and the mirrors $M_{13}$, $M_{14}$ may be suitably displaced, whereby the image-conjugate point $A_{14}$ and the pupil-conjugate point $B_{12}$ can be kept substantially invariable.

However, where the thickness of the reticle $R_0$ differs greatly, it becomes difficult to completely maintain the conjugate relation between the image and the pupil by the fine adjustment of the optical element as described above. Therefore, as indicated by dots-and-dash line in FIG. 2, protective glass P may be disposed between the reticle $R_0$ and the mirrors $M_{11}$, $M_{21}$ and the first objectives $L_{11}$, $L_{21}$ so as to cover the reticle $R_0$, and when the thickness of the reticle $R_0$ is varied, the protective glass P may be replaced with one having a different thickness. At this time, it is possible to construct such that the sum of the thicknesses of the reticle $R_0$ and the protective glass P as parallel flat plates intervening between the lower surface, i.e., the pattern surface, of the reticle $R_0$ and the first objectives $L_{11}$, $L_{21}$ is always constant. Accordingly, this protective glass P is endowed with the function of correcting the length of the optical path, in addition to the original function of preventing dust or the like from adhering to the reticle $R_0$.

In the embodiment of FIG. 1, the mirrors constituting the optical trombone are formed by the pair of plane mirrors $M_{13}$ and $M_{14}$ or $M_{23}$ and $M_{24}$ orthogonal to each other, but these mirrors may be replaced by a corner cube or a harrow cube, whereby the inclination during the movement of the mirrors can be optically cancelled and thus, the manufacture of the moving device becomes easy. In this case, however, if the laser light enters the edge line portion of the dach surface of the corner cube or the harrow cube, the laser light will be scattered and alignment accuracy will be reduced and therefore, it is desirable to make such a design that no light enters the edge line portion. Also, in the above described embodiment, the transmission type scanner $S_0$ is used as the laser beam scanning means, whereas this is not restrictive, but of course, the light projecting system may be constructed by the use of a reflection type scanner or the like.

The optical path length compensating device used in the above-described reduction projection type exposure apparatus may be used not only in an alignment optical system but also in various measuring apparatuses using microscope objectives or projection inspection apparatuses for enlarging and projecting the object point, to effectively display the above-described functions.

What we claimed is:

1. An optical path length compensating device comprising:
   first objective means having one focus coincident with a two-dimensional plane and provided for movement along said two-dimensional plane;
   second objective means having one focus coincident with a predetermined focal plane;
   first and second reflecting means provided in the optical path between said first objective means and said second objective means for movement along said optical path;
   said first reflecting means including at least one reflecting surface for turning the optical path from said first objective means by a predetermined angle in a plane parallel to said two-dimensional plane, said second reflecting means including at least one pair of reflecting surfaces for directing the light from said first reflecting means to said second objective means;
   means for moving said first objective means and said first reflecting means in operative association with each other; and
   means for moving said second reflecting means so that the other focus of said first objective means and the other focus of said second objective means are coincident with each other.

2. An alignment optical apparatus comprising:
   a first objective optical system having one focus coincident with the surface of a photomask and a second objective optical system having one focus coincident with a predetermined focal plane, said first objective optical system and said second objective optical system having the other focuses coincident with each other;
   first reflecting means provided between said first objective optical system and said second objective optical system, an optical path extending in a first direction parallel to said surface of the photomask being formed between said first objective optical system and said first reflecting means, said first reflecting means reflecting the optical path from said first objective optical system in a second direction parallel to said surface of the mask;
   second reflecting means provided between said first reflecting means and said second objective optical system, said second reflecting means having at least one pair of reflecting surfaces and reflecting the optical path from said first reflecting means in a direction parallel to said second direction;

first drive means including means for moving said first objective optical system in said first direction relative to said surface of the photomask, and means for moving said first optical system and said first reflecting means as a unit in said second direction relative to said surface of the photomask; and second drive means for moving said second reflecting means in said second direction in response to said first drive means so that the other focuses of said first and second objective optical systems are coincident with each other.

3. An alignment optical apparatus according to claim 2, wherein said first objective optical system includes an objective and a reflecting mirror provided on the optic axis of said objective.

4. An alignment optical apparatus according to claim 2, wherein said first direction and said second direction are orthogonal to each other.

* * * * *